United States Patent
Chen

(10) Patent No.: US 10,228,802 B2
(45) Date of Patent: Mar. 12, 2019

(54) METHOD FOR MANUFACTURING TOUCH PANEL, TOUCH PANEL AND TOUCH DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Peng Chen, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 492 days.

(21) Appl. No.: 14/908,086

(22) PCT Filed: Jul. 28, 2015

(86) PCT No.: PCT/CN2015/085317
§ 371 (c)(1),
(2) Date: Jan. 27, 2016

(87) PCT Pub. No.: WO2016/155168
PCT Pub. Date: Oct. 6, 2016

(65) Prior Publication Data
US 2016/0306450 A1  Oct. 20, 2016

(30) Foreign Application Priority Data
Mar. 31, 2015  (CN) .......................... 2015 1 0148165

(51) Int. Cl.
*G06F 3/044* (2006.01)
*G03F 7/20* (2006.01)

(52) U.S. Cl.
CPC ............ *G06F 3/044* (2013.01); *G03F 7/2002* (2013.01); *G06F 2203/04103* (2013.01); *G06F 2203/04111* (2013.01)

(58) Field of Classification Search
CPC ........... G06F 3/044; G06F 2203/04103; G06F 2203/04111; G03F 7/20; G03F 7/2002
(Continued)

(56) References Cited
U.S. PATENT DOCUMENTS

2005/0030048 A1  2/2005  Bolender et al.
2011/0069033 A1  3/2011  Meng et al.
(Continued)

FOREIGN PATENT DOCUMENTS

CN   102023770 A   4/2011
CN   103092411 A   5/2013
(Continued)

OTHER PUBLICATIONS

Computer-generated translation of WO 2015/016510 (Feb. 2015). (Year: 2015).*

(Continued)

*Primary Examiner* — John A McPherson
(74) *Attorney, Agent, or Firm* — Brooks Kushman P.C.

(57) ABSTRACT

The present disclosure provides a method for manufacturing a touch panel, a touch panel and a touch display device. The method for manufacturing a touch panel includes a step of forming connecting lines, black matrixes, an isolating film, a plurality of first touch electrodes and a plurality of second touch electrodes. Each of the first touch electrodes comprises a plurality of first sub-electrodes separated from each other, adjacent first sub-electrodes are bridged to each other by a corresponding connecting line, and each of the second touch electrodes is insulated from the connecting line by the isolating film. The black matrixes and the isolating film are formed by one patterning process.

3 Claims, 9 Drawing Sheets

(58) Field of Classification Search
USPC .................................................. 430/319, 321
See application file for complete search history.

(56) References Cited

U.S. PATENT DOCUMENTS

| | | | | |
|---|---|---|---|---|
| 2014/0360855 A1* | 12/2014 | Kim | ........................ | G06F 3/044 |
| | | | | 200/600 |
| 2015/0251393 A1* | 9/2015 | Kanna | ...................... | G06F 3/044 |
| | | | | 428/334 |
| 2016/0306450 A1 | 10/2016 | Chen | | |

FOREIGN PATENT DOCUMENTS

| | | | | |
|---|---|---|---|---|
| CN | 203084688 U | 7/2013 | | |
| CN | 104699308 A | 6/2015 | | |
| WO | WO-2015016510 A1 * | 2/2015 | ............. | G06F 3/044 |

OTHER PUBLICATIONS

First Office Action for Chinese Application No. 201510148165.8, dated Mar. 15, 2017, 6 Pages.
International Search Report and Written Opinion for Application No. PCT/CN2015/085317, dated Dec. 7, 2015, 13 Pages.

* cited by examiner

METHOD FOR MANUFACTURING TOUCH PANEL, TOUCH PANEL AND TOUCH DISPLAY DEVICE

CROSS-REFERENCE TO RELATED APPLICATION

This application is the U.S. national phase of PCT Application No. PCT/CN2015/085317 filed on Jul. 28, 2015, which claims a priority of the Chinese Patent Application No. 201510148165.8 filed on Mar. 31, 2015, the disclosures of which are incorporated in their entirety by reference herein.

TECHNICAL FIELD

The present disclosure relates to the field of touch screen, and in particular to a method for manufacturing a touch panel, a touch panel and a touch display device.

BACKGROUND

At present, a touch panel may be of a G-G structure or a One Glass Solution (OGS) structure. In the touch panel of the G-G structure, a touch sensor is arranged on an ordinary glass, and then the ordinary glass on which the touch sensor is arranged is bonded with a protective glass. The G-G structure can be made by a simple manufacturing process and has a good compatibility with a production line of array substrate; however, the G-G structure is formed by bonding two layers of glasses, so a final G-G structure is thick and a transmissivity thereof is low. In the touch panel of the OGS structure, a lightproof black matrixes, a protective organic resin and a touch electrode are formed directly on a glass. Compared with the G-G structure, only one glass is used in the OGS structure, so the structure is simple and a transmissivity is large. In addition, a production cost is reduced and a product yield is improved since only one glass substrate is used and one bonding process is saved.

Therefore, the OGS structure may be the leading trend of the touch control industry. However, at present, even though a production cost of the OGS touch panel is smaller than that of the G-G touch panel, the manufacturing process of the OGS touch panel still includes a plurality of pattering processes, and each of the patterning processes is time-consuming and expensive. Therefore, how to reduce the times of the patterning process in the method for manufacturing the OGS touch panel in the related art is a technical problem to be solved at present.

SUMMARY

An object of the present disclosure is to provide a method for manufacturing a touch panel, a touch panel and a touch display device, so that a manufacturing time cost may he reduced and a manufacturing cost may be reduced.

In view of this, a method for manufacturing a touch panel is provided by an embodiment of present disclosure, comprising a step of forming connecting lines, black matrixes, an isolating film, a plurality of first touch electrodes and a plurality of second touch electrodes. Each of the first touch electrodes comprises a plurality of first sub-electrodes separated from each other, adjacent first sub-electrodes are bridged to each other by a corresponding connecting line, and each of the second touch electrodes is insulated from the connecting line by the isolating film. The black matrixes and the isolating film are formed by one patterning process.

Optionally the method includes forming the first touch electrodes and the second touch electrodes on a base substrate by one patterning process; forming, on the base substrate on which the first touch electrodes and the second touch electrodes are arranged, the black matrixes and the isolating film by one patterning process; and forming, on the base substrate on which the black matrixes and the isolating film are arranged, the connecting line by one patterning process.

Alternatively, the method includes forming the connecting line on a base substrate by one pattering process; forming, on the base substrate on which the connecting line is arranged, the black matrixes and the isolating film by one patterning process; and forming, on the base substrate on which the black matrixes and the isolating film are arranged, the first touch electrodes and the second touch electrodes by one patterning process.

Optionally, the step of forming the black matrixes and the isolating film by one patterning process includes forming an insulating black matrix material layer; coating a photoresist onto the black matrix material layer; exposing and developing the photoresist by using a mask plate, so as to form a photoresist fully-reserved region and a photoresist fully-unreserved region, wherein the photoresist fully-reserved region corresponds to a region where a pattern of the black matrixes and a pattern of the isolating film are located, and the photoresist fully-unreserved region corresponds to the other regions; etching the black matrix material layer in the photoresist fully-unreserved region, so as to form the patterns of the black matrixes and the isolating film formed by the black matrix material; and removing the residual photoresist.

Optionally, the step of forming the black matrixes and the isolating film by one patterning process includes forming in sequence a transparent insulating material layer and a black matrix material layer; coating a photoresist onto the black matrix material layer; exposing and developing the photoresist by a partially-exposing mask plate, so as to form a photoresist fully-reserved region, a photoresist partially-reserved region and a photoresistfully-unreserved region, wherein the photoresist fully-reserved region corresponds to a region where a pattern of the black matrixes is located, and the photoresist partially-reserved region corresponds to a region where a pattern of the isolating film is located, and the photoresist fully-unreserved region corresponds to the other regions; etching the black matrix material layer and the transparent insulating material layer in the photoresist fully-unreserved region; ashing the photoresist in the photoresist partially-reserved region; etching the black matrix material layer in the photoresist partially-reserved region, so as to form the pattern of the isolating film by the transparent insulating material layer and the pattern of the black matrixes by both the transparent insulating material layer and the black matrix material layer; and removing the residual photoresist.

In addition, a touch panel manufactured by the method hereinabove is further provided by another embodiment of the present disclosure, wherein the black matrixes is arranged at a layer and made of a material identical to the isolating layer.

In addition, a touch display device including the touch panel hereinabove is further provided by another embodiment of the present disclosure.

The technical scheme of the present disclosure has the following advantages: compared with the related art, the black matrixes and the isolating film of the touch panel provided by the present disclosure are formed by one

DETAILED DESCRIPTION

In order to make the technical issues to be solved, technical solutions and the advantages of the present disclosure more apparent, the present disclosure will be described hereinafter in detail in conjunction with the drawings and embodiments. Obviously, the following embodiments merely relate to a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, directly or indirectly, rather than to be limited to physical or mechanical connection. Such words as "on/above", "under/below", "left" and "right" are merely used to represent relative position relationship, and when an absolute position of the object is changed, the relative position relationship will be changed too.

In order to solve the technical issues existed in the related art, a method for manufacturing a touch panel is provided by the present disclosure, including a step of forming connecting lines, black matrixes, an isolating film, a plurality of first touch electrodes and a plurality of second touch electrodes. Each of the first touch electrodes comprises a plurality of first sub-electrodes separated from each other, adjacent first sub-electrodes are bridged to each other by a corresponding connecting line, and each of the second touch electrodes is insulated from the connecting line by the isolating film.

Compared with the related art, the black matrixes and the isolating film are formed by one patterning process.

Compared with the related art, one patterning process is saved according to the manufacturing method provided by the present disclosure, thereby reducing a manufacturing time cost, saving materials and reducing a production cost.

The manufacturing method provided by the present disclosure may be described in detail in conjunction with some embodiments.

Embodiment I

In Embodiment I, the manufacturing method includes the following three patterning processes.

A first patterning process is described as follows.

Figure 1A:
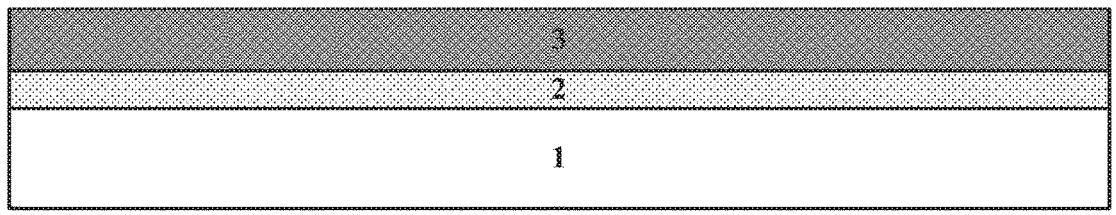
FIGS. 1A-1D are schematic views showing a touch panel where first touch electrodes and second touch electrodes are formed by a first patterning process according to an embodiment of the present disclosure.

Referring to FIG. 1A, a transparent conductive layer 3 (e.g., made of ITO) is deposited on a base substrate 1 on which a shadow-elimination layer 2 is arranged wherein the shadow-elimination layer is deposited on the entire base substrate so no patterning process is needed.

Figure 1B:
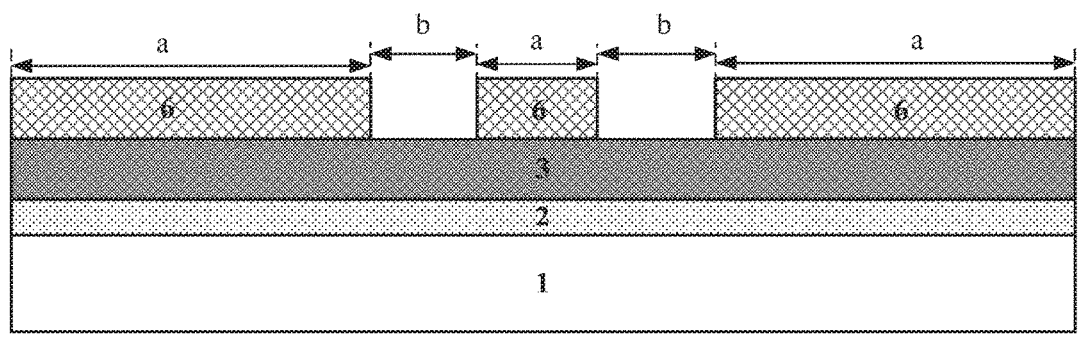

Referring to FIG. 1B, a photoresist 6 is coated onto the transparent conductive layer 3, and the photoresist 6 is exposed and developed by using a mask plate, so as to form a photoresist 6 fully-reserved region and a photoresist 6 fully-unreserved region. The photoresist 6 fully-reserved region a corresponds to a region where a pattern of first sub-electrodes and a pattern of second sub-electrodes connected directly to each other are located, and the photoresist 6 fully-unreserved region b corresponds to the other regions.

Figure 1C:
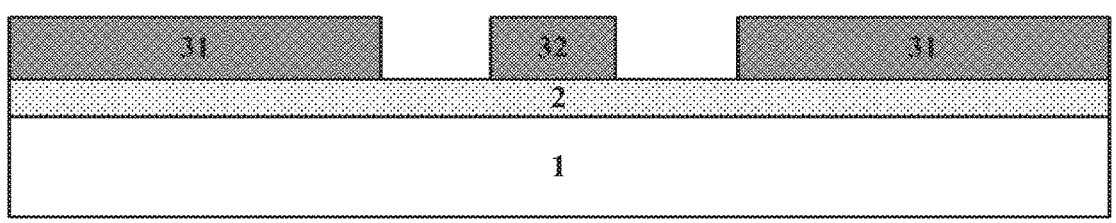

Referring to FIG. 1C, the transparent conductive layer in the photoresist 6 fully-unreserved region b is etched, and then the residual photoresist 6 is removed, so as to form the first sub-electrodes 31 and the second sub-electrodes 32.

Figure 1D:
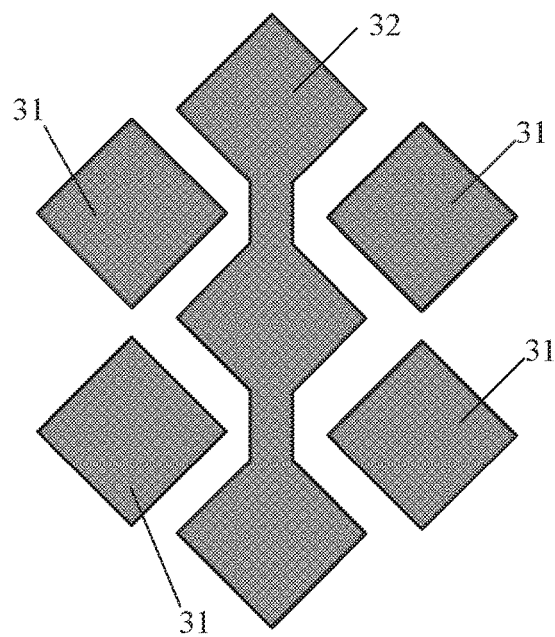

FIG. 1D is a top view of the base substrate shown in FIG. 1C. The first touch electrodes include the first sub-electrodes 31 separated from each other, and the second touch electrodes include the second sub-electrodes 32 connected to each other.

The second pattering process is described as follows.

Figure 2A:
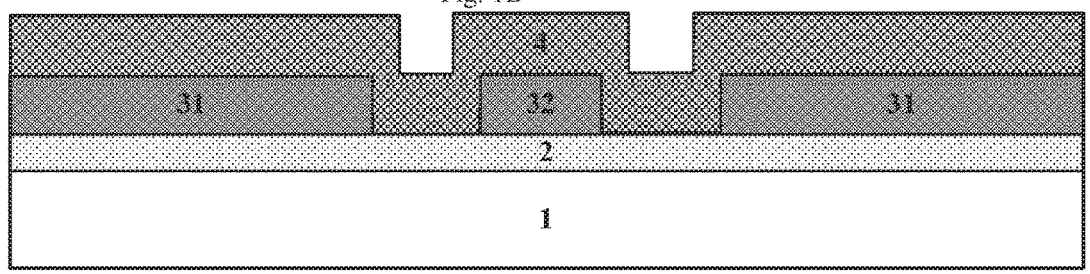
FIGS. 2A-2D are schematic views showing a touch panel where black matrixes and an isolating film are formed by a second patterning process according to an embodiment of the present disclosure.

Referring to FIG. 2A, an insulating black matrix material layer 4 is formed on the base substrate 1 on which the first touch electrodes and the second touch electrodes are arranged.

Figure 2B:
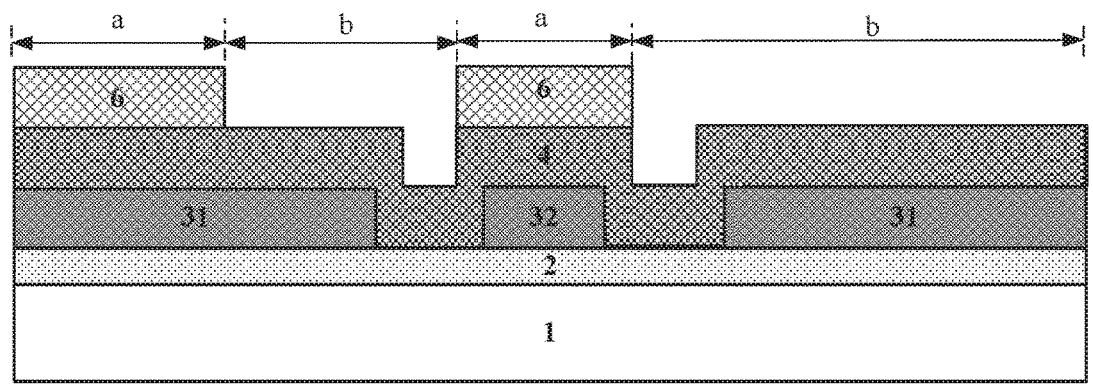

Referring to FIG. 2B, the photoresist 6 is coated onto the black matrix material layer, and then the photoresist 6 is exposed and developed by using a mask plate, so as to form a photoresist 6 fully-reserved region a and a photoresist 6 fully-unreserved region b. The photoresist fully-reserved region a corresponds to a region where a pattern of the black matrixes and a pattern of the isolating film are located, and the photoresist fully-unreserved region b corresponds in the other regions.

Figure 2C:
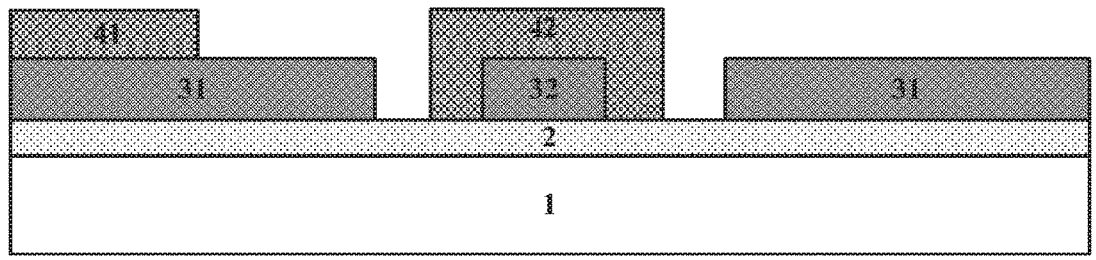

Referring to FIG. 2C, the black matrix material layer in the photoresist 6 fully-unreserved region b is etched, and the residual photoresist 6 is removed, so as to form the pattern of the black matrixes 41 and the pattern of the isolating film 42.

Figure 2D:
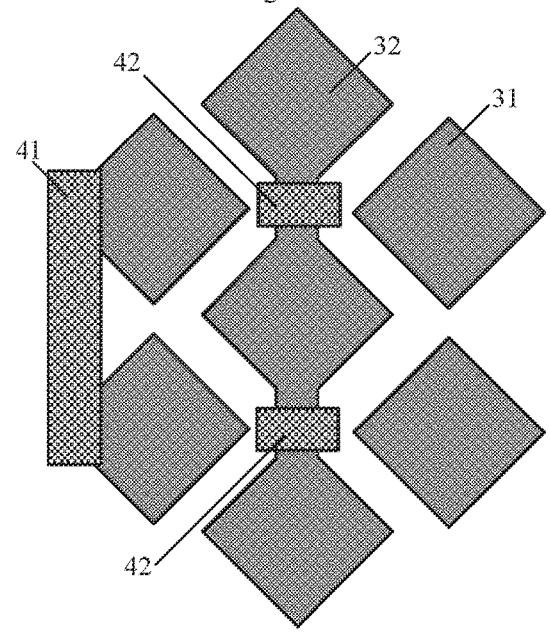

FIG. 2D is a top view of the base substrate shown in FIG. 2C. The black matrixes 41 in FIG. 2D is arranged in a non-display area, and the isolating film 42 covers a region by which the second sub-electrodes are connected to each other.

A third patterning process is described as follows.

Figure 3A:
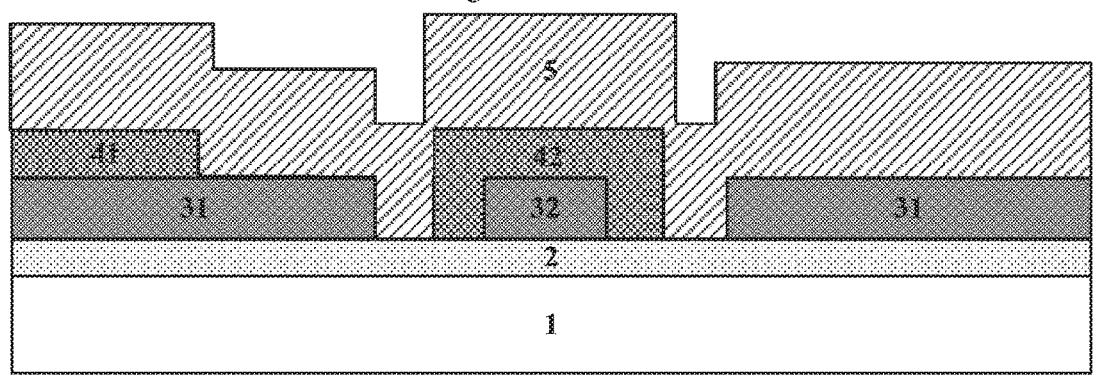
FIGS. 3A-3D are schematic views showing a touch panel where connecting lines are formed by a third patterning process according to an embodiment of the present disclosure.
Figure 3B:
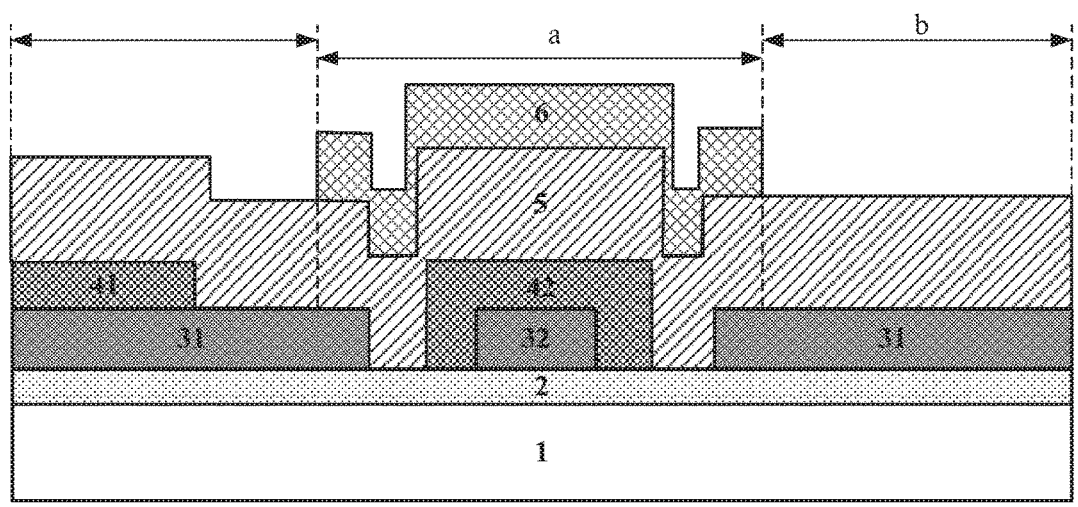

Referring to FIG. 3A, a conductive layer 5 is deposited on the base substrate on which the black matrixes and the isolating film are arranged. The conductive layer 5 may include metal, and accordingly the connecting lines formed subsequently are metal lines. Referring to FIG. 3B, the photoresist 6 is coated onto the conductive layer 5, and the photoresist 6 is exposed and developed by using a mask plate, so as to from a photoresist 6 fully-reserved region and a photoresist 6 fully-unreserved region. The photoresist 6 fully-reserved region a corresponds to a region where a pattern of the connecting lines is located, and the photoresist 6 fully-unreserved region b corresponds to the other regions.

Figure 3C:
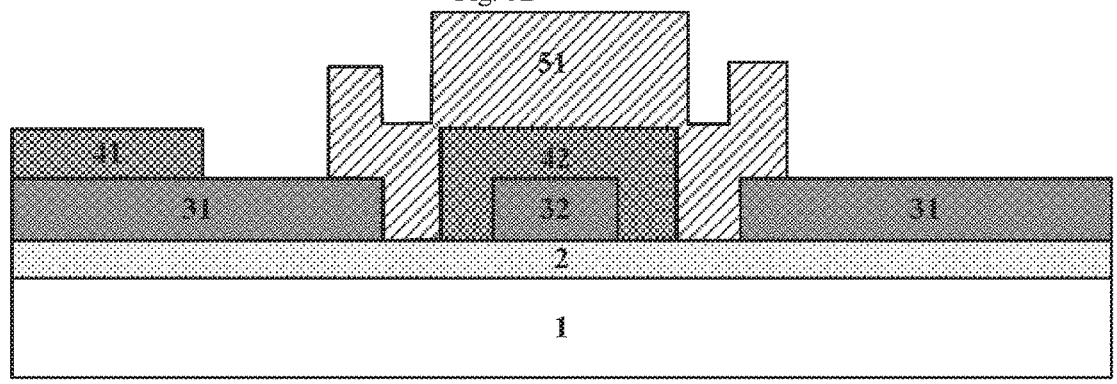

Referring to FIG. 3C, the conductive layer in the photoresist 6 fully-unreserved region b is etched, and then the residual photoresist 6 is removed, so as to from the connecting line 51 bridging the first sub-electrodes.

Figure 3D:
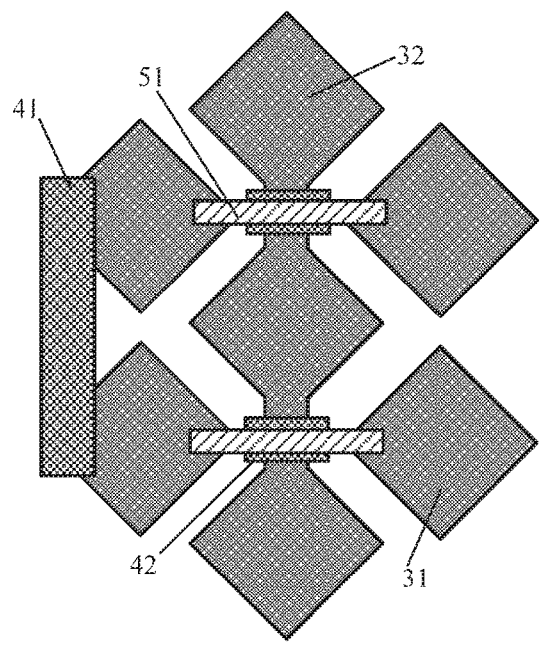

FIG. 3D is a top view of the base substrate shown in FIG. 3C. The connecting line 51 is separated from the second touch electrodes by the isolating film, so that the first touch electrode and the second touch electrode are insulated from each other.

The whole patterning process in forming the touch panel is described hereinabove. In Embodiment I, the black matrixes and the isolating film is made of the same material, thereby reducing the material cost. In addition, compared with the related art, a manufacturing method including only three patterning processes are presented, thereby improving a production efficiency of the touch panel significantly and then reducing a production cost.

Embodiment II

Another manufacturing method including three patterning processes is provided in Embodiment II, including the following processes.

Figure 4A:
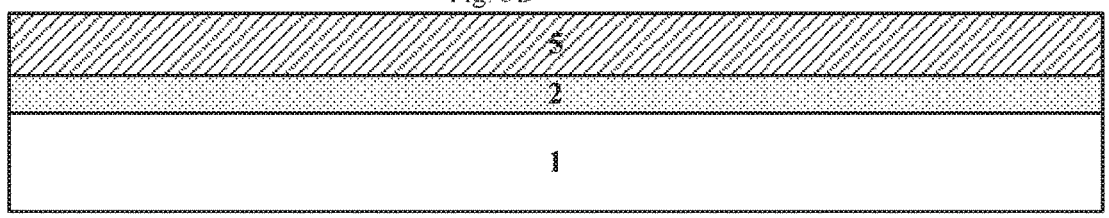
FIGS. 4A-4C are schematic views showing a touch panel where connecting lines are formed by a first patterning process according to an embodiment of the present disclosure.

A first patterning process is described as follows,

Referring to FIG. 4A, a conductive layer 5 is deposited on a base substrate 1 on which a shadow-elimination layer 2 is arranged. The shadow-elimination layer is deposited on the entire base substrate so no patterning process is needed. The conductive layer 5 is the material layer for forming the connecting line in Embodiment I.

Figure 4B:
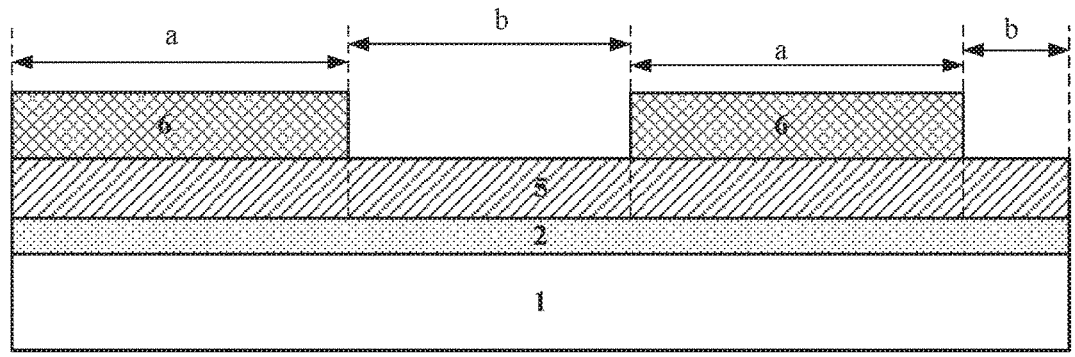

Referring to FIG. 4B, a photoresist 6 is coated onto the transparent conductive layer 5, and the photoresist 6 is exposed and developed by using a mask plate, so as to form a photoresist 6 fully-reserved region and a photoresist 6 fully-unreserved region. The photoresist 6 fully-reserved region a corresponds to a region where a pattern of the connecting lines is located, and the photoresist 6 fully-unreserved region b corresponds to the other regions.

Figure 4C:
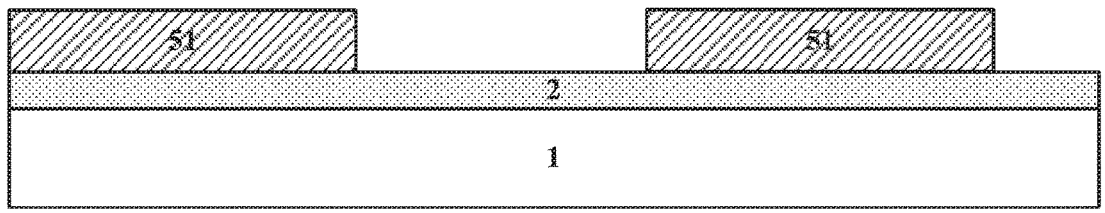

Referring to FIG. 4C, the transparent conductive layer 6 in the photoresist 6 fully-unreserved region b is etched, and then the residual photoresist 6 is removed, so as to form the connecting lines 51.

A second patterning process is described as follows.

Figure 5A:
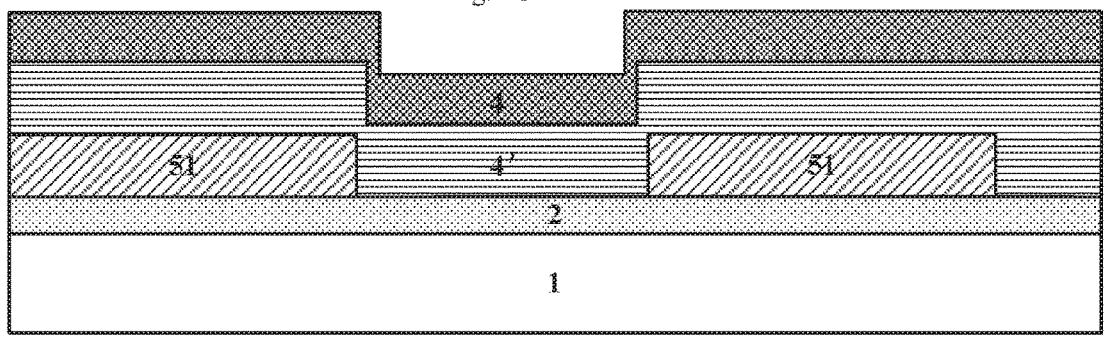
FIGS. 5A-5D are schematic views showing a touch panel where black matrixes and an isolating film are formed by a second patterning process according to an embodiment of the present disclosure.

Referring to FIG. 5A, a transparent insulating material layer 4' and a black matrix material layer 4 are formed in sequence on the base substrate 1 on which the connecting lines are arranged.

Figure 5B:
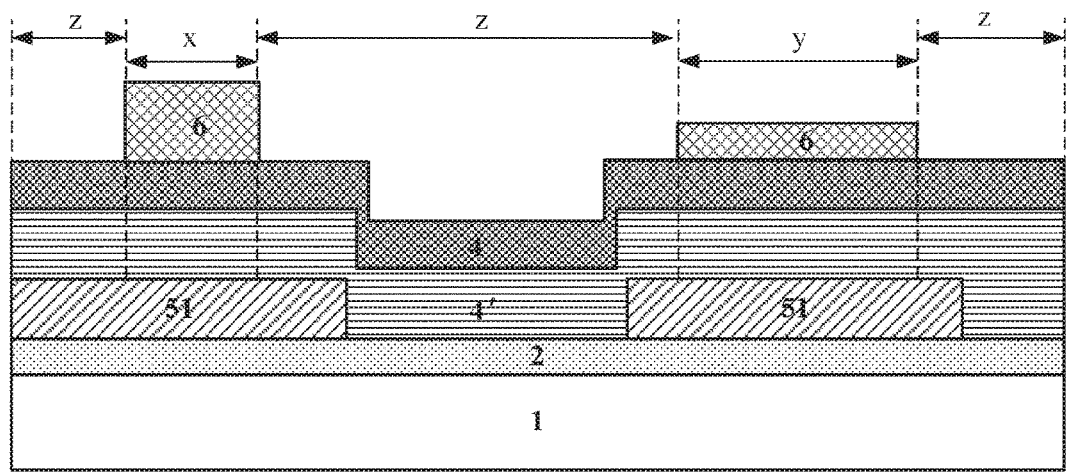

Referring, to FIG. 5B, the photoresist 6 is coated onto the black matrix material layer, so as to form a photoresist 6 fully-reserved region x, a photoresist 6 partially-reserved region y and a photoresist 6 fully-unreserved region z. The photoresist 6 fully-reserved region x corresponds to a region where a pattern of the black matrixes is located, and the photoresist 6 partially-reserved region y corresponds to a region where a pattern of the isolating film is located, and the photoresist 6 fully-unreserved region z corresponds to the other regions.

Figure 5C:
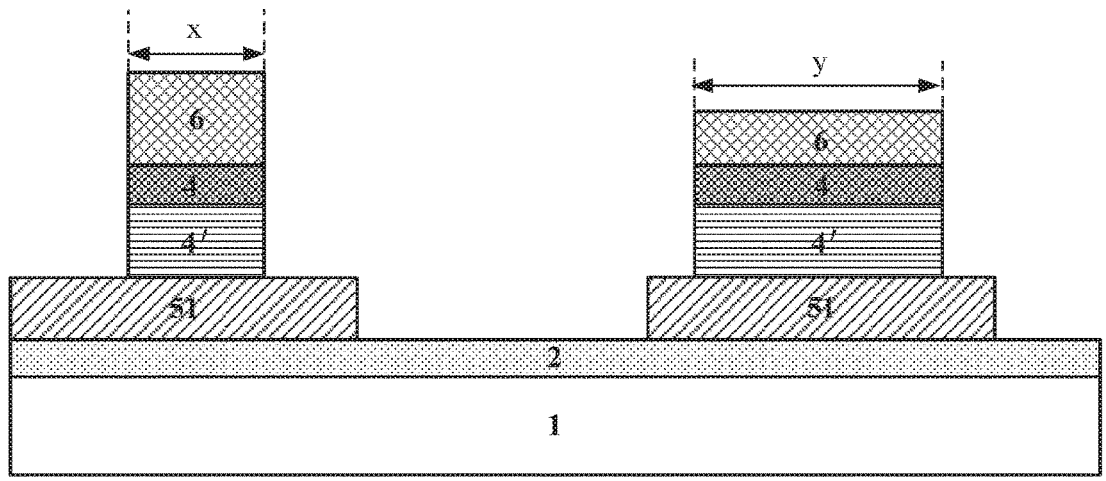

Referring, to FIG. 5C, the black matrix material layer and the transparent insulating material layer in the photoresist 6 fully-unreserved region z are etched.

Figure 5D:
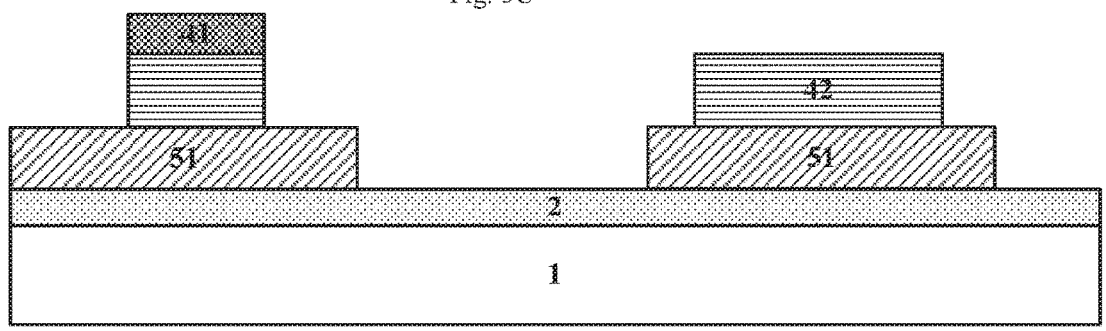

Referring to FIG. 5D, the photoresist 6 in the photoresist 6 partially-reserved region y is ashed, and the black matrix material layer in the photoresist 6 partially-reserved region y is etched, and then the residual photoresist 6 is removed, so as to form the black matrixes 41 and the isolating film 42.

A third patterning process is described as follows.

Figure 6A:
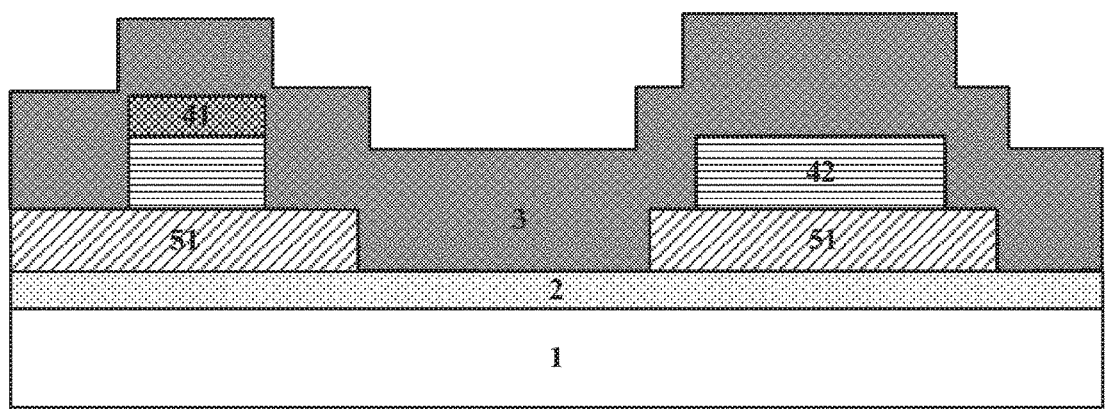
FIGS. 6A-6C are schematic views showing a touch panel where first touch electrodes and second touch electrodes are formed by a third patterning process according to an embodiment of the present disclosure.

Referring to FIG. 6A, a transparent conductive layer 3 (e.g., ITO, IZO) is deposited on the base substrate on which the black matrixes and the isolating film are arranged.

Figure 6B:
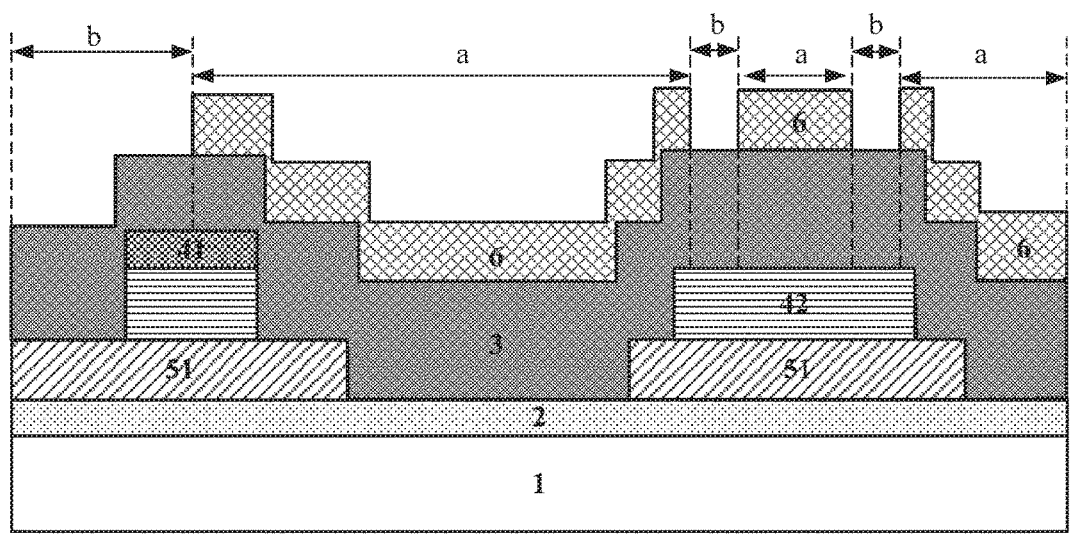

Referring to FIG. 6B, a photoresist 6 is coated onto the conductive layer 3, and the photoresist 6 is exposed and developed by using a mask plate, so as to from a photoresist 6 fully-reserved region and a photoresist 6 fully-unreserved region. The photoresist 6 fully-reserved region a corresponds to the region where the pattern of the connecting lines is located, and the photoresist 6 fully-unreserved region b corresponds to the other regions.

Figure 6C:
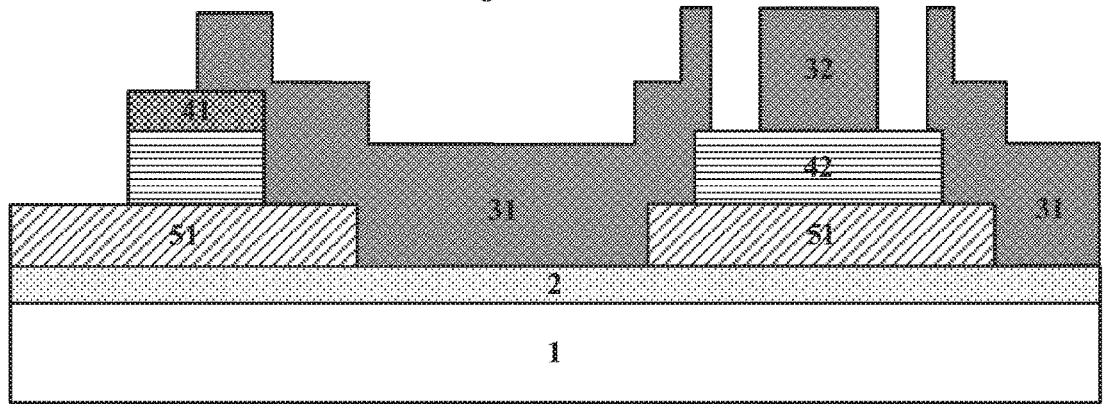

Referring to FIG. 6C, the transparent conductive layer in the photoresist 6 fully-unreserved region b is etched and then the residual photoresist 6 is removed, so as to form first touch electrodes including first sub-electrodes 31 and second touch electrodes including second sub-electrodes 32 connected to each other directly.

Figure 7:
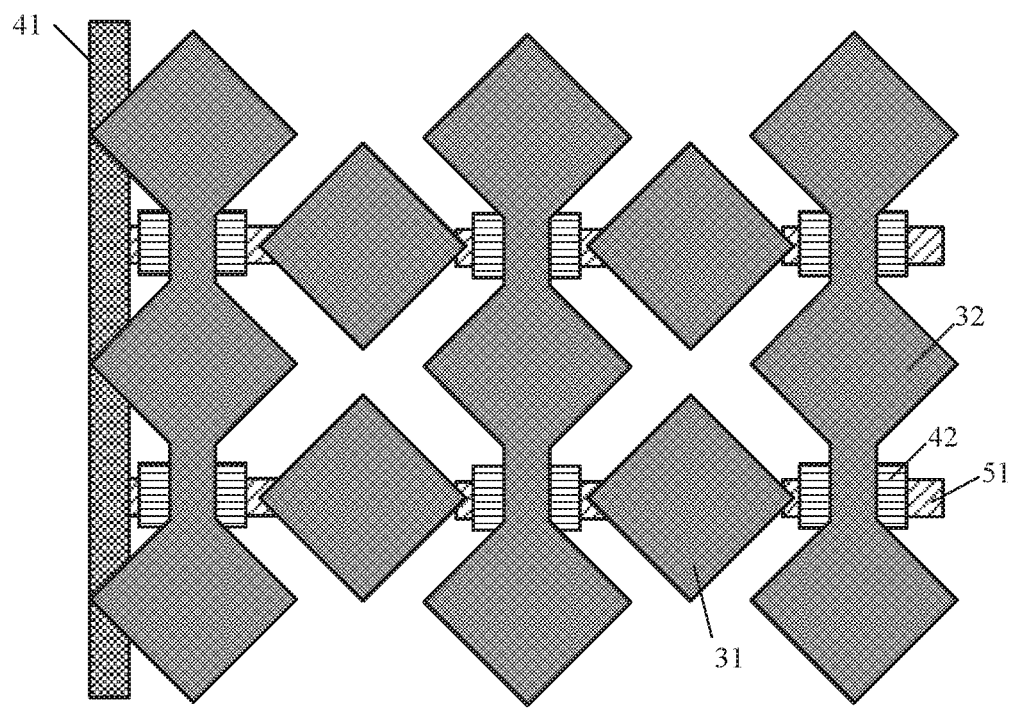
FIG. 7 is a schematic view showing a touch substrate manufactured by the manufacturing method according to the present disclosure.

The whole patterning process in forming the touch panel is described hereinabove, and the final touch panel including an array pattern is shown in FIG. 7. The first sub-electrodes 31 of the first touch electrodes are bridged to each other by the corresponding connecting lines 51. The second touch electrodes (including the second sub-electrodes 32) are insulated from the first touch electrodes by the isolating films 42. The black matrix 41 is arranged at an edge of the touch panel, i.e., a non-display region.

In Embodiment II, the isolating layer is made of a transparent material, so a transmissivity of the display region is larger than that in Embodiment I.

According to the description of Embodiments I and II, a touch panel may be manufactured by only three patterning processes, thereby reducing significantly the time cost of production and then reducing a production cost.

In addition, a touch panel manufactured by the manufacturing method hereinabove and a touch display including the touch panel are provided by the present disclosure. The touch display may a cell phone, a PAD, a television and so on, and optionally the touch display has an OGS structure (i.e., the touch panel of the touch display is arranged at an inner side of a display panel of the touch display). As shown in FIG. 3C, the black matrixes of the touch panel is arranged at a layer and made of a material identical to the isolating layer of the touch panel.

The above are merely the preferred embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A method for manufacturing a touch panel, comprising a step of forming connecting lines, black matrixes, an isolating film, a plurality of first touch electrodes and a plurality of second touch electrodes;

wherein each of the first touch electrodes comprises a plurality of first sub-electrodes separated from each other, adjacent first sub-electrodes are bridged to each other by a corresponding connecting line, and each of the second touch electrodes is insulated from the connecting line by the isolating film; and the method further comprises:

forming the black matrixes and the isolating film by one patterning process, wherein the step of forming the black matrixes and the isolating film by one patterning process comprises:

forming in sequence a transparent insulating material layer and a black matrix material layer;

coating a photoresist onto the black matrix material layer;

exposing and developing the photoresist by a partially-exposing mask plate, so as to form a photoresist fully-reserved region, a photoresist partially-reserved region and a photoresist fully-unreserved region, wherein the photoresist fully-reserved region corresponds to a region where a pattern of the black matrixes is located, and the photoresist partially-reserved region corresponds to a region where a pattern of the isolating film is located, and the photoresist fully-unreserved region corresponds to the other regions;

etching the black matrix material layer and the transparent insulating material layer in the photoresist fully-unreserved region;

ashing the photoresist in the photoresist partially-reserved region;

etching the black matrix material layer in the photoresist partially-reserved region, so as to form the pattern of the isolating film by the transparent insulating material layer and the pattern of the black matrixes by both the transparent insulating material layer and the black matrix material layer; and removing the residual photoresist.

2. The method according to claim 1, comprising:

forming the first touch electrodes and the second touch electrodes on a base substrate by one patterning process;

forming, on the base substrate on which the first touch electrodes and the second touch electrodes are arranged, the black matrixes and the isolating film by one patterning process; and forming, on the base substrate on which the black matrixes and the isolating film are arranged, the connecting line by one patterning process.

3. The method according to claim 1, comprising:

forming the connecting line on a base substrate by one pattering process;

forming, on the base substrate on which the connecting line is arranged, the black matrixes and the isolating film by one patterning process; and forming, on the base substrate on which the black matrixes and the isolating film are arranged, the first touch electrodes and the second touch electrodes by one patterning process.

* * * * *